United States Patent [19]

Angiulli et al.

[11] Patent Number: 5,323,293
[45] Date of Patent: Jun. 21, 1994

[54] ARRANGEMENT FOR PLACING CENTRAL PROCESSORS AND MEMORY IN A CRYO COOLED CHAMBER

[75] Inventors: John M. Angiulli, LaGrangeville; Arun K. Ghose, Hyde Park; Richard R. Konian; Samuel R. Levine, both of Poughkeepsie; Kevin P. Moran, Wappingers Falls; Vincent C. Vasile, Marlboro, all of N.Y.

[73] Assignee: International Business Machines Corporation, Armonk, N.Y.

[21] Appl. No.: 993,271

[22] Filed: Dec. 18, 1992

[51] Int. Cl.[5] ............................................. H05K 7/20
[52] U.S. Cl. .................................. 361/699; 62/259.2; 165/104.33; 257/716; 361/711
[58] Field of Search .................... 174/15.1, 15.4, 16.1; 62/259.2, 376; 165/80.3, 80.4, 185, 104.33; 257/713, 714, 716; 361/382, 385–389, 688, 689, 699, 702, 704, 717, 707, 711

[56] References Cited

U.S. PATENT DOCUMENTS

| | | | |
|---|---|---|---|
| 4,330,812 | 5/1982 | Token | 361/386 |
| 4,630,096 | 12/1986 | Drye | 361/401 |
| 4,962,444 | 10/1990 | Niggemann | |
| 4,986,078 | 1/1991 | Laskaris | 62/259.2 |
| 5,095,404 | 3/1992 | Chao | 361/385 |
| 5,121,292 | 6/1992 | Bell et al. | |
| 5,126,830 | 6/1992 | Mueller | 357/83 |
| 5,142,443 | 8/1992 | Moore, Jr. | 361/385 |

OTHER PUBLICATIONS

IBM Tech Discl. Bull. vol. 21 No. 8 Jan. 1979, pp. 3378–3380, Ahearn, "Silicon Heat Sink . . . ".
IBM Tech. Discl. Bull. vol. 20 No. 7 Dec. 1977, pp. 2759, Hwang, "Liquid . . . Module".

Primary Examiner—Gerald P. Tolin

[57] ABSTRACT

A low temperature conduction module comprising a cold plate having recesses around the periphery thereof to accommodate memory cubes is disclosed. The recesses accommodating the memory cubes are of such depth and dimension as to enclose the memory cube on all but one side, thereby greatly enhancing the conduction of the heat generated by the memory cube to the cold plate. The memory cube may be surrounded by a material which possesses excellent thermal conductive properties to insure efficient transfer of the heat from the memory cube to the cold plate. The plurality of memory cubes so positioned within the cold plate may be connected by a flexible cable surrounding the cold plate and having branch conductors extending to connect with computer processors enclosed within the same low temperature conduction module.

10 Claims, 2 Drawing Sheets

ARRANGEMENT FOR PLACING CENTRAL PROCESSORS AND MEMORY IN A CRYO COOLED CHAMBER

FIELD OF THE INVENTION

This invention relates to the cryogenic cooling of central processors and memory in a computer system, and specifically for the positioning of a central processor within a cryogenic cooler along with the associated requisite memory devices necessary to reduce the amount of time delays due to interconnection lengths and to improve electronic chip response through cryogenic cooling.

BACKGROUND OF THE INVENTION

It is very desirable to reduce the distance between the central processor and the memory so that operand and instruction access times are reduced to a minimum. The central processor can have a faster cycle time when operating at cryogenic temperatures. When the memory is placed with the central processor within the cryo-cooled system, both the memory and the central processor not only benefit from the lower temperatures that they operate at but also by the reduced distance between the central processor and the memory. Due to the long lines associated with Dynamic Random Access Memory (DRAM) memories, a greater performance improvement can be anticipated for the DRAM memory than for the logic. When the memory is so close to the processor, it can negate the need for a Cache Memory and thus have a greater savings.

It is desirable to cool the memory and the central processor by means of a cold head of a cryo cooler. The cold head of a cryo cooler is the heat exchange point whereby a cryo cooling system picks up or absorbs the heat from electronic devices. The heat absorption is accomplished by the cooling of a plate which is in surface-to-surface contact with an external surface of a cooling module. The cooling module contains these electronic devices. The heat is conducted from the electronic devices to the mating surface of the cooling module. The mating surface of the cooling module, being in face-to-face relationship with the plate of the cold head, then transfers the heat generated by these electronic devices to the refrigeration system through the cold head, and the heat is conveyed to another point or station where this heat may be dissipated in a conventional manner.

The access time between the Cache Memory and the Main Memory is greatly reduced in this configuration due to the fact that the Main Memory is placed electrically close to the processors due to this unique configuration under cryogenic temperatures. It could be possible to realize a memory access speed improvement of up to a factor of 5 in this unique configuration.

By placing the central processor and the memory within the same cooling module or low temperature conduction module and as closely together as possible, the performance of the system may be increased by a factor of as much as 2.5.

With the requirements for large quantities of memory and very close placement of the memory to the central processor, the memory chips are combined into assemblies known as memory cubes. Memory cubes are a plurality of memory chips packaged in a generally cubical shape; the chips are stacked and bonded together to form the cube. The electrical contacts for each memory chip are typically routed to one edge of the chip so that the contacts may be exposed to the circuitry used to connect the memory to the central processor.

In memory chips stacked to form a cube, one very significant disadvantage is that heat dissipation is significantly curtailed; accordingly, the chips have a tendency to operate at very high temperatures. Memory cubes are extremely difficult to cool because the heat must be transmitted and conducted from the center of the cube to the exterior surfaces. The silicon slabs on which the chips are made are poor heat conductors at room temperatures; therefore, the heat is prone to build up in the chips and in the memory cube during any operation. But at cryogenic temperatures, the silicon slabs are good heat conductors; therefore allowing the heat to be conducted away.

In a vacuum, the chips and memory cube must rely on conduction for cooling. Only surfaces which are engaged by a conduction member can be cooled, further complicating cooling of memory cubes in vacuums.

Attempts to operate memory cubes at room temperature have proven to be unsatisfactory because of the heat build up within the cube structure and due to the stresses on the materials of the memory chip, created by such heat build up. In many cases, the chips will fail when the centermost portion of the cube attempts to expand much more than the periphery of the cube, thereby breaking electrical paths or cracking the silicon substrates, thereby causing chip failure.

A sophisticated cooling system is required to make memory cubes functional. Low temperature offers the best opportunity to achieve this goal with enhanced performance. Memory cubes have the distinct advantage of producing very short cycle times and reduction of system complexity, for example the elimination of Cache Memory. Therefore, some short cycle systems are dependent upon formation of memory chips into cubes in order to reduce the interconnection distances between individual chips. Dense placement of memory chips permits the placement of a multitude of chips close to the computer processor.

If adequate cooling of the memory cubes is possible, an arrangement to position a significant quantity of memory, in the form of memory cubes, must be devised in close proximity to the computer processor. This requires the maintenance of both the computer processor and the memory cubes at very low temperatures in order to prevent overheating and to enhance the cycle times of the memory and processor. Whenever the DRAM is maintained in an environment of cryogenic temperatures, the added benefit of reduction in the number of cycles and the electrical requirements necessary to refresh the DRAMs result in an added benefit to the system designer, inasmuch as this further reduces overheating or makes the memory and processor available for their primary functions.

Prior art attempts to cool electronic elements to cryogenic temperatures have included U.S. Pat. No. 5,121,292 to David F. Bell et. al., where liquid nitrogen was used to chill a cold head. In turn, the cold head was engaged with the cold plate of a cryo cooled chamber containing individual chips attached to a substrate. In turn, the substrate is in contact with the heat transfer plate of the cryo cooled unit. While this structure is quite effective to cool individual chips, it does not lend itself to the cooling of memory cubes each containing a plurality of chips, and especially when several memory cubes may be required within a single cryo cooled unit.

SUMMARY OF THE INVENTION

It is an object of the invention to cool multiple memory cubes and to position the memory cubes in close proximity to the computer processor for the most efficient operation of the processor.

It is another object of the invention to sufficiently cool the computer processor and the memory cubes so that they may be operated at enhanced performance levels within the cryo cooled unit.

It is a further object of the invention to enclose the memory cubes on a plurality of sides of each cube within a portion of the cold plate of the cryo cooled unit.

It is a still further object of the invention to reduce or eliminate the need to position the memory associated with a cryo cooled computer processor, outside the cryo cooled unit.

The disadvantages of the prior art are overcome, the advantages of the present invention accomplished, together with the accomplishments of the objects of the invention, with the formation of the cold plate of the cryo cooled unit in such a way that as the cold plate periphery extends into the internal volume of the cryo cooled unit, the thickness of the cold plate will substantially accommodate recesses which can contain a memory cube.

The volume of the cold plate is thus increased to accommodate recesses or pigeon holes into the cold plate structure. The pigeon holes formed into the cold plate structure are dimensioned so that the memory cubes can be fitted into the openings and can be substantially enclosed on five sides of the cube. The sixth side of the cube is left exposed to the exterior of the cold plate thereby affording the opportunity to connect adequate cabling between the chips and the central processor.

Inasmuch as the cold plate of the cryo cooled unit typically is circular in shape, the periphery of the entire cold plate may be provided with the recesses or pigeon holes for a plurality of memory cubes. The unengaged planar or top surface of the cold plate may be further utilized as a support for the central processor assembly, which may include several individual chips.

A plurality of memory cubes may be connected to the central processor through a flexible circuit which passes around the periphery of the cold plate interconnecting the several memory cubes and then branches over the top of the cold plate to connect to the electronics positioned thereon.

The mass of a thickened peripheral portion of the cold plate provides a significant heat sink to cool the memory cubes. The thinner central portion provides adequate cooling for the central processors as well as a transmissive path for the conduction of the heat away from the periphery of the disk to the central portion of the disk. The central portion is intimately contacted by the cold head of the cryogenic cooling system.

Heat transfer between the memory cubes and the cold plate may be significantly enhanced by the use of materials which may be placed between the memory cube surfaces and the interior surfaces of the recesses or pigeon holes. The material placed within the small space between the memory cube and the cold plate either may be a thermally conductive paste material or an indium alloy compound, highly deformable and providing very significant thermal conductivity. Deformability of the indium compound is an advantage inasmuch as whenever the memory cube is placed within a recess of the cold plate, the indium compound will be formed against the memory cube surfaces to provide intimate surface-to-surface contact between the indium compound, the internal surface of the cold plate, as well as the external surfaces of the memory cube.

A better understanding of how the objects of the invention are accomplished, the prior art shortcomings are overcome, and the enhanced cryo cooling of both the memory cubes and the computer processors may be had by referring to the drawings and the detailed description of the invention to follow.

DRAWINGS

DETAILED DESCRIPTION OF THE INVENTION

Figure 1:
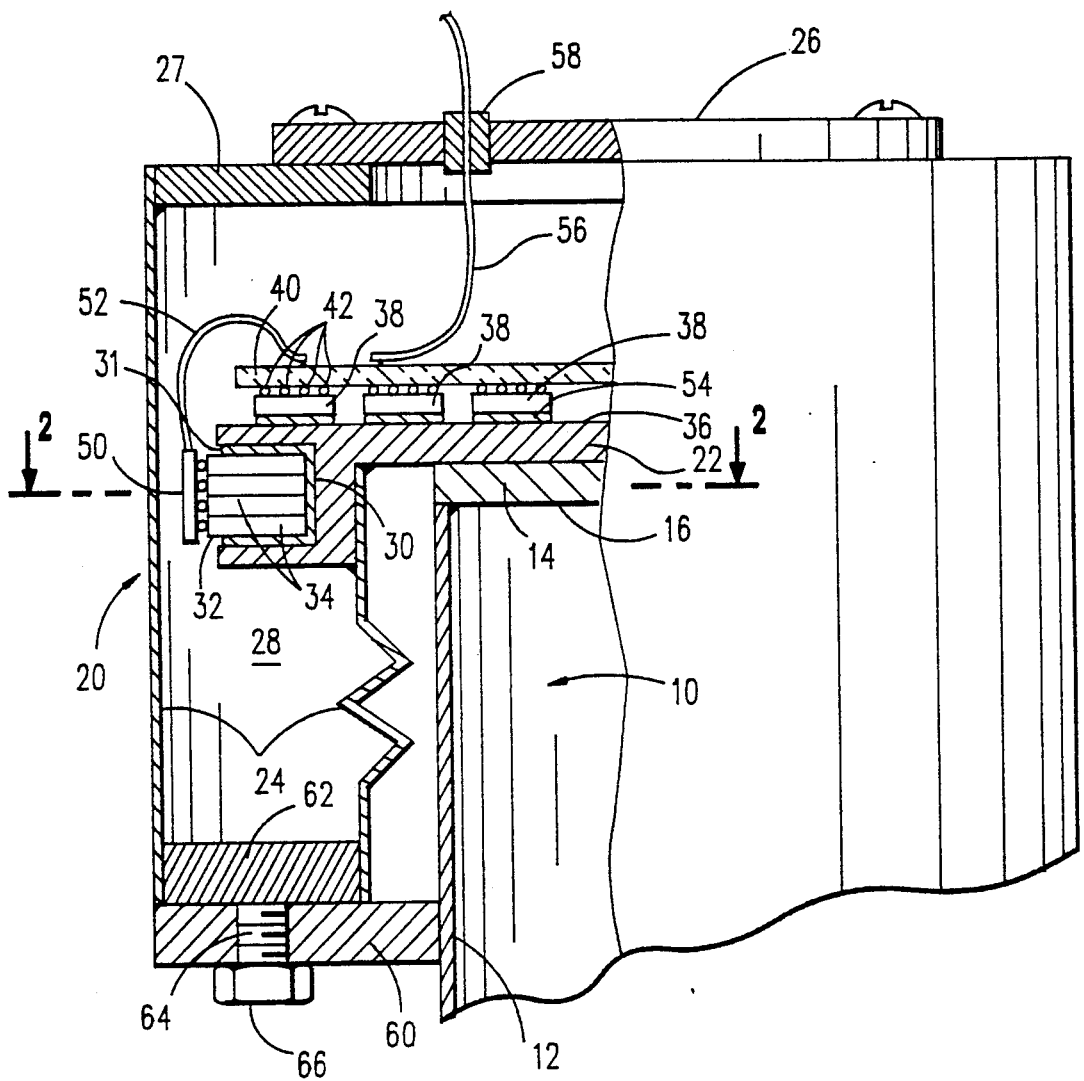
FIG. 1 is a partial sectional view of a low temperature conduction module containing a cold plate of the type utilized in the invention.

Reference is made to FIG. 1. In a typical computer system utilizing a cooling capability for electronic components 32, 38, a cryo cooler 10 is provided. Cryo cooler 10 typically is comprised of walls 12 and a cold head 14. The cryo cooler 10 uses as a source of refrigerant helium gas in a sterling engine, which contacts the underside 16 of the cryo cooler cold head 14. As the cold head 14 is contacted by the helium gas and cooled, the cold head 14 will assume the temperature of or near that of 77 degrees Kelvin. Note that liquid nitrogen can be brought in contact with the cryo cooler head for an alternate immersion technology cooling technique.

The cold head 14 and the cryo cooler 10 are part of the refrigeration system. Positioned in contact with the cryo cooler 10 is a low temperature conduction module 20. Low temperature conduction module (LTCM) 20 is formed of several components, including a cold plate 22, walls 24, top 27 and cover 26. The components of the LTCM 20 form a chamber 28 which has a partial cylindrical and partially annular shape. The cold plate 22 of the LTCM 20 forms the floor of the cylindrical portion of the chamber 28 within the LTCM 20 while at the same time being exposed on the exterior for engagement with the cryo cooler cold head 14. When the two members, cold plate 22 and cold head 14, are placed in engagement with each other, the cold plate 22 will conduct heat to the cold head 14, thus dissipating the heat generated within the LTCM 20. The cold plate 22 typically is a copper plate chosen for its ability to conduct heat and also for its ability to be assembled by means of solder in order to form a seal for a vacuum container.

The cold plate 22 of the present invention is fabricated so that the portion of the cold plate 22 that extends radially into the chamber 28 of the LTCM 20 increases in thickness to the point that the thickness dimension of the cold plate 22 is sufficient to accommodate the formation of a recess 30, sufficient to accommodate a memory cube 32. The radial extension of cold plate 22 likewise should be sufficient to accept the recess 30 of such depth as to substantially enclose the memory cube 32 on five of its six sides.

Memory cubes 32 are comprised of a plurality of memory chips 34 joined at their larger planar faces to create a stack of chips 34. The chips 34 are joined together by an adhesive or other conventional attachment techniques to create a solid cube. The individual chips function independently of each other but are packaged into the cubical shape of memory cube 32 not only for ease in packaging, but also for the advantage of high density memory. The high density of the memory permits the positioning of large quantities of memory close to the computer processor 38 utilizing the memory chips 34.

The chips 34 are provided with edge contacts so that electrical connections may be made to the chips 34 only on one edge of the chip 34. The edge contacts are positioned so that the contacts are exposed outside of the recess 30. The top surface 36 of cold plate 22 provides the mounting surface 36 upon which the chips 34 or computer processor 38 are positioned. The chips 34 typically are solder connected to a module substrate 40 which provides the electrical interconnections and paths to the processors 38 through contact pads which, in turn, are solder connected by means of solder balls 42 to the electronic chips 38. The substrate 40 is positioned then to contact the exposed, planar surface of chips 38 with the cold plate 22 for the purpose of cooling.

The memory chips 34 of memory cube 32 are connected through solder ball contacts or other suitable conventional techniques to a memory-to-logic flex cable 50. Flex cable 50 is provided in turn with a branch 52 which extends upwardly from the region of the memory cubes 32 to make contact with the electrical contacts on module substrate 40. Thermal conductivity between chips 38 and cold plate 22 may be improved by the provision of a thermal enhancement interface 54. Thermal enhancement interface 54 may be an indium compound, a thermal paste, or any other compliant thermally conductive material. For example, the thermally conductive material could be solder if the non-active or non-circuit face of chip 38 is properly prepared and then soldered directly to the copper cold plate 22. Soldering defeats the ability to easily change a defective chip; but at the same time, soldering provides a very good thermally conductive path.

An external flex cable 56 is provided to transmit the electrical signals between the electronic module substrate 40 and devices and connections, not shown, external to the LTCM 20. Flex cable 56 is typically solder connected to electronic module substrate 40 and passes through a hermetic seal 58 in the cover 26 of the LTCM 20. The details of the hermetic seal are not shown inasmuch as they do not constitute part of this invention. However, the technique for passing the cable 56 through the wall of LTCM 20 may use the approach described in co-pending application Ser. No. 07/899,414, filed Jun. 16, 1992, by W. S. Harris, et al., titled *Low Temperature Conduction Module With Gasket To Provide A Vacuum Seal And Electrical Connections* and commonly assigned herewith and now issued as U.S. Pat. No. 5,242,424.

The cryo cooler 10 may be provided with a flange 60 extending outwardly from the cylindrical exterior wall 12 of the cryo cooler 10 and the LTCM 20 may further be provided with a bottom plate 62. Bottom plate 62 may carry a threaded attaching member 64, when engaged by nut 66, which permits the rigid attachment of the LTCM 20 to the cryo cooler 10 thereby insuring an intimate face-to-face engagement with cryo cooler cold head 14 and copper cold plate 22 for maximum thermal conductivity and minimal gap resistance to the heat flow to the cold head 14.

Figure 2:
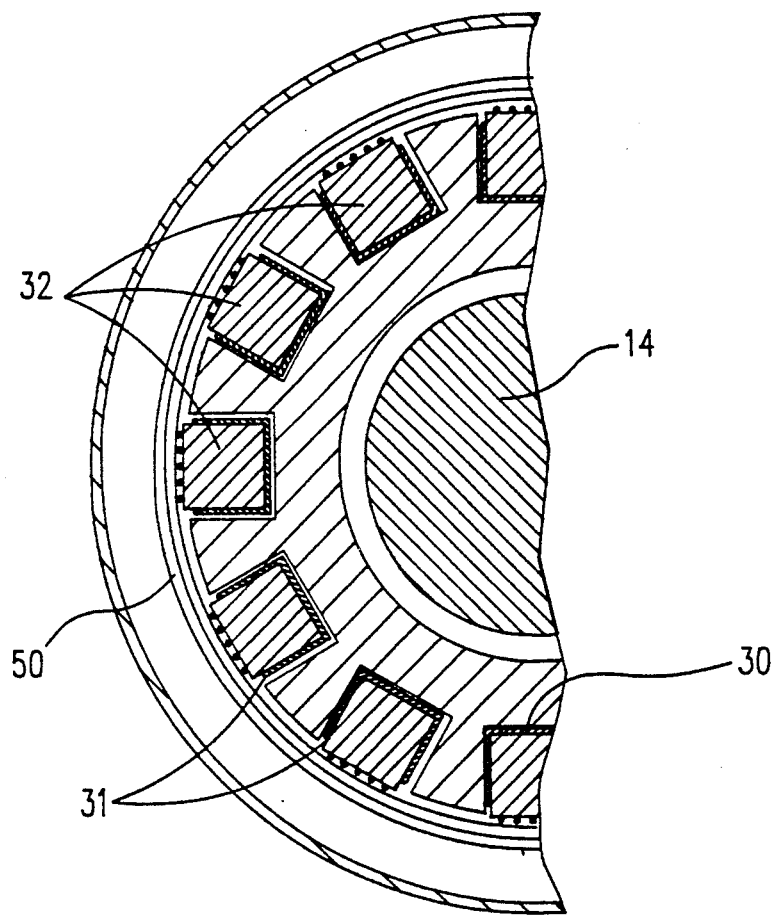
FIG. 2 is a sectional view of the cold head and cold plate of FIG. 1 taken along line 2—2.

Referring to FIG. 2, the memory-to-logic flex cable 50 is routed circumferentially around cold plate 22 and electrically connected to the exposed electrical contact pads on the external faces of memory cubes 32. By interconnecting all of the memory cubes 32 with the flex cable 50, rapid accessibility to memory by the computer processor 38 is accomplished.

In order to improve the thermal conductivity between the memory cube 32 and the cold plate 22, the interface between the memory cube 32 and cold plate 22 recess 30 may be filled with a material which is highly heat conductive. This material may be an indium sheet 31 such as a foil. Indium is a very soft material and will easily deform as the memory cube 32 is inserted into recess 30. The deformation of the indium foil 31 will insure intimate face-to-face contact between the surfaces of the memory cube 32 and the internal surfaces of recess 30. Should a portion of the memory cube 32 subsequently prove to be defective, the memory cube 32 may be removed and either repaired or replaced as necessary. Upon the re-insertion of the memory cube 32 into the recess 30, the indium foil 31 or other thermal enhancement material will again deform to insure efficient surface-to-surface contact. Indium has the further advantage that it does not give off vapors when the LTCM 20 is evacuated.

After the combination as shown in FIGS. 1 and 2 is fully assembled, the entire device is sealed and a vacuum created within the LTCM 20. With the LTCM 20 thermally attached to the cryo cooler 10 and the cold plate 22 positioned into intimate face-to-face contact with the cold head 14, the cooling of the cryo cooler 10 in turn will cool the electronic chips 38 or central processor 38 as well as the memory cubes 32.

With the memory cubes 32 surrounded on five sides, the cooling of the memory cube 32 is greatly enhanced compared to that of a single surface cooling or the use of cold air flow. With the memory cubes 32 efficiently cooled by contact on five of the six sides of the cube 32, the memory cubes 32 may be much more densely positioned in the LTCM 20 and that, in turn, permits a much shorter conductor path between the memory chips 34 and the processors 38. With the cryogenic cooling of the electrical components 32, 34, 28 and the shorter conductive paths between them, shorter cycle times for the memory and more efficient use of the processors 38 is accomplished. By elimination of the more frequent refreshing requirements of the air cooled DRAM devices, the disclosed system greatly improves the performance of the electronics. The improved cooling of the memory cubes 32 further reduces the power requirements of the memory chips 34 and processors 38, through the elimination of high resistance paths and excessive refreshing of the DRAM chips 34.

While the invention has been disclosed using memory cubes 32, if the recesses 30 conform to the individual chips 34, it is further possible to utilize individual chips. Additionally, it would be possible to provide a cold plate 22 sufficiently thick in the central portion, space permitting, to enclose additional memory cubes 32 within recesses formed into the top surface 36 of the cold plate 22 so long as the requirements for the top surface permitted.

Clearly, modifications may be made to the invention as disclosed without departing from the scope of the claims to follow.

We claim:

1. A cryogenically coolable thermal conduction module for containing and cooling electronic circuit chips having a plurality of faces, said module comprising:
   a container having at least a top wall, a bottom wall, and a side wall which define an internal volume;
   said bottom wall having a planar, thermally conductive plate exposed for engagement with a cryogenically cooled cold head;
   said bottom wall further having an internal cylindrical portion extending axially from the periphery of said bottom wall and having a thickness in the radial direction in excess of one dimension of at least one face of at least one electronic chip; and
   at least one recess formed into the exterior of said cylindrical portion which accepts at least one said chip into each said recess and which contacts at least a plurality of said faces of at least one said chip,
   whereby heat generated within said chip is conducted away from said at least one chip through any of a plurality of said faces, to said plate.

2. The module of claim 1 wherein each said bottom wall recess comprises a plurality of faces which accept and contact the faces of a stack of a plurality of said chips, formed into a cube of chips.

3. The module of claim 2 wherein said bottom wall contacts said cube of chips on five sides of said cube.

4. The module of claim 1 wherein each said bottom wall recess is lined with a thermally conductive material of a malleable nature to conform to said recess and to each said chip to intimately contact each said recess and each said chip.

5. The module of claim 1 further comprising electrical connections for each said chip.

6. The module of claim 5 further comprising at least one further electronic chip disposed on and thermally connected to said bottom wall.

7. A thermal conduction module for containing and cooling electronic circuit chips assembled into a cube comprising a cubical volume of chips, said cube having a plurality of faces, said module comprising:
   a container having at least a top wall, a bottom wall, and a side wall which define an internal volume;
   said bottom wall having a planar, thermally conductive plate exposed for engagement with a cryogenically cooled cold heat;
   said bottom wall further having an internal portion extending axially from the periphery of said bottom wall and having a thickness in the radial direction in excess of one dimension of at last one face of said cube of said electronic chips; and
   at least one recess, formed into the exterior of said axially extending portion, which accepts at least one said cube into said recess and which contacts at least a plurality of said faces of said cube,
   whereby heat generated within said chips forming said cube is conducted away from said chips through any of said plurality of said faces, to said bottom plate.

8. The thermal conduction module of claim 7 wherein each said bottom wall recess is lined with a thermally conductive material of a malleable nature to conform to each said recess and to each said chip to intimately contact each said recess and each said chip.

9. The thermal conduction module of claim 7 further comprising electrical connections for each said chip.

10. The thermal conduction module of claim 7 further comprising at least one further electronic chip disposed on and thermally connected to said bottom wall.

* * * * *